(12) United States Patent
Dobuzinsky et al.

(10) Patent No.: US 6,806,200 B2
(45) Date of Patent: Oct. 19, 2004

(54) METHOD OF IMPROVING ETCH UNIFORMITY IN DEEP SILICON ETCHING

(75) Inventors: David Dobuzinsky, New Windsor, NY (US); Siddhartha Panda, Beacon, NY (US); Rolf Weis, Dresden (DE); Richard Wise, New Windsor, NY (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 10/291,951

(22) Filed: Nov. 8, 2002

(65) Prior Publication Data

US 2004/0092122 A1 May 13, 2004

(51) Int. Cl.[7] .......................................... H01L 21/302
(52) U.S. Cl. ...................................... 438/710; 438/711
(58) Field of Search ................................ 438/710, 711

(56) References Cited

U.S. PATENT DOCUMENTS

| | | | | |
|---|---|---|---|---|
| 4,784,720 A | * | 11/1988 | Douglas | 438/695 |
| 4,855,017 A | * | 8/1989 | Douglas | 438/695 |
| 5,286,344 A | * | 2/1994 | Blalock et al. | 438/723 |
| 5,965,679 A | * | 10/1999 | Godschalx et al. | 526/281 |
| 5,972,722 A | * | 10/1999 | Visokay et al. | 438/3 |
| 6,033,997 A | * | 3/2000 | Perng | 438/765 |
| 6,211,034 B1 | * | 4/2001 | Visokay et al. | 438/396 |
| 6,232,228 B1 | * | 5/2001 | Kwag et al. | 438/669 |
| 6,268,289 B1 | * | 7/2001 | Chowdhury et al. | 438/687 |
| 6,288,188 B1 | * | 9/2001 | Godschalx et al. | 526/285 |
| 6,294,423 B1 | * | 9/2001 | Malik et al. | 438/241 |

* cited by examiner

*Primary Examiner*—John F. Niebling
*Assistant Examiner*—Olivia T. Luk
(74) *Attorney, Agent, or Firm*—Steven Capella

(57) ABSTRACT

A method is disclosed for improving etch uniformity in deep silicon etching of a monocrystalline silicon wafer. Such method includes forming a pad dielectric layer on a wafer including monocrystalline silicon, forming a silicon layer over the pad dielectric layer, and then applying a clamp to an edge of the wafer. The silicon layer is then removed except in areas protected by the clamp. Thereafter, a hardmask layer is applied and patterned on the wafer; and the wafer is then directionally etched with the patterned hardmask to etch trenches in the monocrystalline silicon.

In such manner, a source of silicon (in the silicon layer) is provided at the wafer edge, such that the silicon loading is improved. In addition, the silicon layer at the wafer edge forms a blocking layer which prevents formation of black silicon.

8 Claims, 1 Drawing Sheet

METHOD OF IMPROVING ETCH UNIFORMITY IN DEEP SILICON ETCHING

FIELD OF THE INVENTION

The invention relates generally to semiconductor fabrication, and more particularly, to the deep etching of semiconductor wafers.

BACKGROUND OF THE INVENTION

In the fabrication of integrated circuits (ICs), trenches are typically formed in a substrate, such as a silicon wafer. In some dynamic random access memories (DRAMs), cell storage capacitors are formed in deep trenches etched in silicon wafers.

In a conventional technique for etching deep trenches, a pad dielectric layer and a hard mask layer are deposited on the semiconductor substrate. A photoresist layer is then patterned over the hard mask layer, to define locations in the hardmask (and the underlying silicon wafer) to be etched. A directional etch is then applied, e.g. reactive ion etch (RIE), whereby the hard mask layer is patterned with the underlying layer(s) and the underlying silicon is etched to these patterns. The etch continues to form a deep trench in the semiconductor substrate. The remaining hard mask is then removed, and subsequent wafer processing continues, to form storage capacitors in the deep trenches, or perhaps deep isolation structures, as by filling the etched deep trenches with a dielectric material.

A dielectric (typically oxide) is used as the hard mask layer, to provide adequate selectivity, as the sputter yield of silicon is much greater than that of a dielectric mask. In general, both mask selectivity and available hardmask thickness at are much lower at the wafer edge than at the patterned areas, leading to loss of the hardmask at exposed wafer edges. Consequently, micro masking occurs at the wafer edge, such that large spikes of silicon material (needle-type surfaces usually between about 3 to 7 microns in length) form during the deep trench etch.

The resulting spiked surface is known as "black silicon". Black silicon formed during RIE is easily broken off, in turn becoming particles, and can adversely impact manufacturing yield. The resultant particle contamination can affect both the subject wafer and the tools which handle wafers.

Black silicon is the description given to severe micromasking that typically occurs at the edge of silicon wafers during deep silicon etching with a dielectric (e.g. oxide) hardmask. Under such circumstances, black silicon generally arises as follows:

1) near exposed edges of the wafer, where the selectivity of the hardmask is reduced due to Si load; and
2) in areas where the hardmask is thinned due to previous processing, e.g. areas in which the mask open process has eroded the hardmask material.

The incorporation of electrostatic chuck (ESC) tools into the mask open and silicon etch process has provided higher chip yield at the wafer edge, due to a more uniform etch rate. However, although the overall etch rate is more uniform, the exposed edges of the wafer are subject to a high mask loss rate, due to elevated wafer temperature (since helium cooling does not extend to the edge of the wafer) and enhanced ion flux (due to field curvature) at the wafer edge.

In addition, during deep silicon etching, the mask selectivity is at least partially dependent on the silicon load, i.e. the silicon containing byproducts that make up part of the protective film which is deposited during the etch onto the dielectric hardmask. At the wafer edge, there is a reduced level of silicon due to the finite area of the wafer. Although it is possible to provide elevated levels of silicon at the wafer edge by installing a silicon containing ring in the silicon etch tool, this in turn cases rapid removal of the tool internal parts, driving up the cost of operating the process chamber, as well as causing severe black silicon formation inside the chamber.

One possible way of preventing black silicon damage may include using a mask open tool with cover ring to prevent mask loss. This approach does prevent formation of black silicon in areas where the mask is thin, but leads to severe non-uniformity at the wafer edge (due to etch rate variations) and does nothing to prevent the formation of black silicon near exposed edges.

A similar method that may be used is to utilize a silicon etch tool with a cover ring to prevent mask loss. Again while this method may relieve the mask thinning problem, but it leads to severe non-uniformity of the trench depth as the silicon etch rate is reduced to zero in the vicinity of the cover ring. In addition, problems due to loading effects at the edge of the wafer still remain.

An existing method of removing black silicon is by bevel RIE. In bevel RIE, the wafer is coated with a mid-UV photoresist and the edge bead is removed. An isotropic, non-selective etch is then performed to remove all material at the wafer edge. The problem with this approach, however, since the focus is not on black silicon prevention, particle contamination occurs at all gates (from the time of the deep trench etch) up until the isotropic etch is completed. In addition, when the isotropic etch is performed, lateral undercut of trenches may occur, itself potentially leading to the formation of contaminating particles.

SUMMARY OF THE INVENTION

Accordingly, a method and apparatus are provided by the present invention to reduce or prevent formation of black silicon. In addition, the present invention provides a source of silicon at the wafer edge to improve uniformity during silicon etch.

These and other objects are provided by the present method of improving etch uniformity in deep silicon etching of a monocrystalline silicon wafer. Such method includes forming a pad dielectric layer on a wafer including monocrystalline silicon, forming a silicon layer over the pad dielectric layer, and then applying a clamp to an edge of the wafer. The silicon layer is then removed except in areas protected by the clamp. Thereafter, a hardmask layer is applied and patterned on the wafer; and the wafer is then directionally etched with the patterned hardmask to etch trenches in the monocrystalline silicon.

In such manner, a source of silicon (in the silicon layer) is provided at the wafer edge, such that the silicon loading is improved. In addition, the silicon layer at the wafer edge forms a blocking layer which prevents formation of black silicon.

DETAILED DESCRIPTION OF THE PREFERRED EMBODIMENTS

Figure 1:
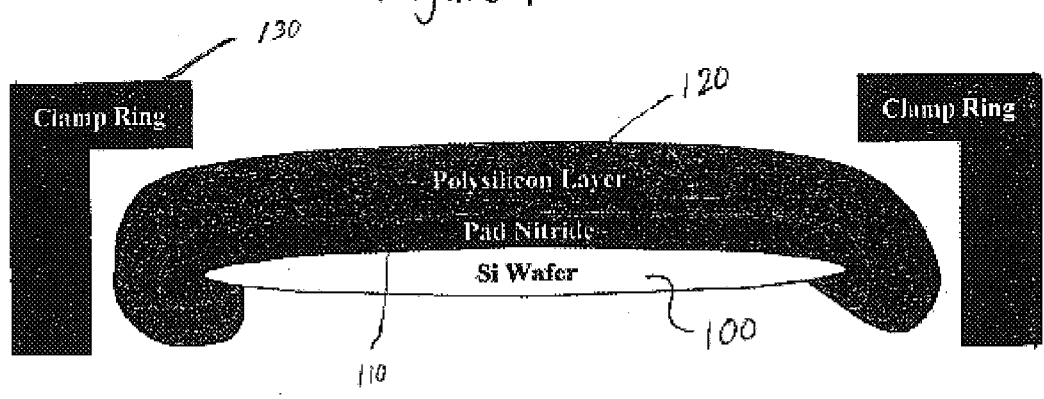
FIGS. 1 and 2 illustrate steps in an embodiment of the invention.

The present invention takes advantage of the fact that wafer clamp tools limit etch rate. FIG. 1 illustrates an embodiment of the invention. In the example shown in FIG. 1, a clamp tool is shown as a ring at (130), although edge-clamping tools are not necessarily all of ring shape. A pad dielectric 110, preferably silicon nitride, is deposited on a wafer 100. A sacrificial film layer 120, preferably of polysilicon, is then applied. LPCVD (low pressure chemical vapor deposition) is preferably used to ensure edge coverage of the wafer.

The wafer is then clamped by clamp ring 130 in an etch tool. The sacrificial film layer 120 is then removed everywhere except from under the overhanging edges of the clamp tool (everywhere except around the wafer edge, preferably within about 1 mm from the wafer edge, although the overhang shown is preferably less than 1 mm). The pad dielectric layer functions as a stop layer in such process. This is shown to result in a step rise of more than 500 nm at the wafer edge.

Figure 2:
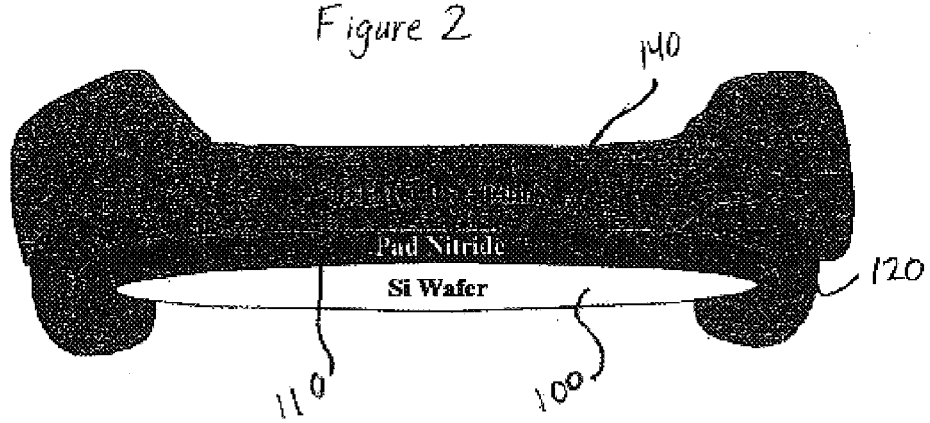

Then, with reference to FIG. 2, the wafer is removed from the clamp tool 130. A dielectric hardmask layer 140, e.g. of borosilicate glass, such as that known to be used as a hardmask for deep trench etching, is applied to the wafer. Thereafter, a photoresist is deposited and patterned. Thus, the wafer 100 is now provided with a pad dielectric layer 110 an oxide hardmask layer 140, and an overlying patterned photoresist layer (not shown). During subsequent deep etching of the silicon wafer 100 using the overlying hardmask 140, the additional silicon available at the wafer edge in sacrificial film 120, prevents the formation of black silicon. In addition, since the silicon load is also increased at the wafer edge, the uniformity of the silicon etch between the center and near the edges of the wafer is greatly increased, thereby potentially increasing the chip yield of the wafer.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of improving etch uniformity in deep silicon etching of a silicon wafer comprising:

forming a pad dielectric layer on a wafer comprising monocrystalline silicon;

forming a silicon layer over said pad dielectric layer;

applying a clamp to an edge of said wafer;

removing said silicon layer except in areas protected by said clamp;

applying and patterning a hardmask layer on said wafer; and directionally etching said wafer with said patterned hardmask to etch trenches in said monocrystalline silicon.

2. The method of claim 1 wherein said clamp comprises a clamp ring.

3. The method of claim 2, wherein said clamp ring overhangs an edge of said wafer to a distance up to about 1 mm from said edge.

4. The method of claim 3, wherein after said removing, said silicon layer remains up to about said distance of said overhang of said clamp ring.

5. The method of claim 1, wherein said silicon layer comprises polysilicon.

6. The method of claim 1 wherein said pad dielectric layer comprises silicon nitride.

7. The method of claim 1 wherein said hardmask layer comprises borosilicate glass.

8. The method of claim 1, wherein said silicon layer is deposited by LPCVD.

\* \* \* \* \*